United States Patent
Wakita et al.

(10) Patent No.: US 6,299,682 B1
(45) Date of Patent: Oct. 9, 2001

(54) METHOD FOR PRODUCING SILICON INGOT HAVING DIRECTIONAL SOLIDIFICATION STRUCTURE AND APPARATUS FOR PRODUCING THE SAME

(75) Inventors: Saburo Wakita; Akira Mitsuhashi; Yoshinobu Nakada; Jun-ichi Sasaki; Yuhji Ishiwari, all of Ohmiya (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 09/658,488

(22) Filed: Sep. 8, 2000

Related U.S. Application Data

(62) Division of application No. 09/257,037, filed on Feb. 25, 1999.

(30) Foreign Application Priority Data

Feb. 25, 1998 (JP) .................................................. 10-043526
Feb. 8, 1999 (JP) .................................................. 11-029927

(51) Int. Cl.⁷ .................................................. C30B 13/14
(52) U.S. Cl. ........................ 117/11; 117/3; 117/7; 117/62; 423/348; 423/349
(58) Field of Search ................................ 65/66; 117/3, 7, 117/11, 62; 423/348, 349

(56) References Cited

U.S. PATENT DOCUMENTS

| | | |
|---|---|---|
| 2,759,230 | 8/1956 | Gordon et al. . |
| 2,875,556 | 3/1959 | Vigna et al. . |
| 4,045,536 | 8/1977 | Wallace . |
| 4,175,610 | 11/1979 | Zauhar et al. . |
| 4,572,812 | 2/1986 | Ciszek . |
| 5,314,667 | 5/1994 | Lim et al. . |
| 5,454,424 | 10/1995 | Mori et al. . |
| 5,961,944 | 10/1999 | Aratani et al. . |
| 6,027,563 | 2/2000 | Choudhury et al. . |

FOREIGN PATENT DOCUMENTS

| | | |
|---|---|---|
| 33 16 546 | 4/1984 | (DE) . |
| 33 23 896 | 1/1985 | (DE) . |
| 0 141 999 | 5/1985 | (EP) . |

OTHER PUBLICATIONS

Muehlbauer, A. et al: "Removal of C/SiC From Liquid Silicon By Directional Solidification" Journal of Crystal Growth, vol. 108, No. 1/02, Jan. 2, 1991 pp. 41–52, XP000204901.

*Primary Examiner*—Felisha Hiteshew
(74) *Attorney, Agent, or Firm*—Oblon, Spivak, McClelland, Maier & Neustadt, P.C.

(57) ABSTRACT

A method for producing a silicon ingot having a directional solidification structure comprising the steps of: placing a silicon raw material into a crucible of a melting device constructed by mounting a chill plate on an underfloor heater, mounting a crucible with a large cross-sectional area on the chill plate, providing an overhead heater over the crucible, and surrounding the circumference of the crucible with a heat insulator; heat-melting the silicon raw material by flowing an electric current through the underfloor heater and overhead heater; chilling the bottom of the crucible by halting the electric current through the underfloor heater after the silicon raw material has been completely melted to form a molten silicon; chilling the bottom of the crucible by flowing an inert gas through the chill plate; and intermittently or continuously lowering the temperature of the overhead heater by intermittently or continuously decreasing the electric current through the overhead heater, and an apparatus for producing the silicon ingot.

10 Claims, 5 Drawing Sheets

METHOD FOR PRODUCING SILICON INGOT HAVING DIRECTIONAL SOLIDIFICATION STRUCTURE AND APPARATUS FOR PRODUCING THE SAME

This appln. is a division of Ser. No. 09/257,037 filed Feb. 25, 1999.

BACKGROUND OF THE INVENTION

1. Field of the Invention

The present invention relates to a method for producing a silicon ingot having a directional solidification structure with a suitable degree of orientation for producing a silicon substrate for use in photovoltaic solar cells, especially to a method for producing a silicon ingot having a directional solidification structure with a wide horizontal cross-sectional area and good degree of orientation.

2. Description of the Related Art

Silicon substrates comprising polycrystalline silicon have been known in the art as a kind of silicon substrate for use in photovoltaic solar cells. The silicon substrate comprising the polycrystalline silicon is produced by slicing a silicon ingot having a directional solidification structure. Although the silicon ingot having a directional solidification structure is thought to be cheaper than the single crystal silicon, many researches are under way for satisfying requirements for much cheaper silicon substrates.

FIG. 5 denotes an illustrative cross section for describing the method for producing a conventional silicon ingot having a directional solidification structure. As shown in FIG. 5(a), the method comprises the steps of filling a raw silicon material 2 in a melting crucible 1, melting the raw silicon material 2 by heating the melting crucible 1 with an induction coil 3, and injecting the molten silicon 8 into a solidification crucible 4 as shown in FIG. 5(b). An insulating heater 5 is provided around the solidification crucible 4 and a baffle 6 for shielding the heat from the heater 5 is additionally provided at the bottom end of the insulating heater 5. A chill plate 7 makes contact with the bottom of the solidification crucible 4. The injected molten silicon in the solidification crucible 4 starts to solidify from the bottom to the top since the bottom of the solidification crucible 4 is chilled with the chill plate 7. An elevator shaft 11 is further provided at the bottom face of the chill plate 7, a directional solidification structure 12 being grown over the entire region of the molten silicon liquid by allowing the molten silicon 8 to solidify from the bottom while the chill plate 7 is descending using the elevator shaft 11 at a velocity synchronizing with the crystal growth speed of the molten silicon. The silicon substrate for use in the photovoltaic solar cell is produced by slicing the silicon ingot after shaving off the side wall part of the silicon ingot, since the side wall of the silicon ingot having a directional solidification structure obtained as described above contains a high concentration of impurities introduced from the crucible 4 as well as a lot of distortion fault.

However, when the silicon ingot obtained has a small horizontal cross-sectional area, the horizontal cross-sectional area of the silicon ingot after shaving off the side wall part becomes still smaller along with increasing the silicon ingot side wall elimination ratio, making it impossible to effectively utilize the expensive silicon raw material.

Accordingly, a silicon ingot having a directional solidification structure with a wide horizontal cross-sectional area as well as an excellent degree of orientation is desired. However, when one attempts to produce a silicon ingot having a wide horizontal cross-sectional area by the conventional production method in which the temperature is controlled by disposing heat generation sources on side faces, the degree of orientation along the vertical (i.e., solidification) direction becomes poor due to temperature differences caused along the horizontal direction, making it impossible to obtain a silicon ingot having a suitable degree of orientation.

SUMMARY OF THE INVENTION

Accordingly, the object of the present invention is to provide a silicon ingot having a good degree of orientation with a wider horizontal cross-sectional area than the conventional silicon ingot.

In one aspect, the present invention provides a method for producing a silicon ingot having a directional solidification structure comprising the steps of: placing a silicon raw material into a crucible of a melting device constructed by mounting a chill plate capable of chilling with a refrigerant on an underfloor heater, mounting the crucible on the chill plate, providing an overhead heater over the crucible, and surrounding the circumference of the crucible with a heat insulator; heat-melting the silicon raw material by flowing an electric current through the underfloor heater and overhead heater while halting refrigerant feed to the chill plate, followed by halting the electric current or decreasing the electric power through the floor heater after the silicon raw material has been completely melted, the molten silicon being chilled from the bottom of the crucible by chilling the chill plate by feeding the refrigerant; and intermittently or continuously lowering the temperature of the overhead heater by intermittently or continuously decreasing electric current through the overhead heater along with halting the electric current or decreasing the electric power through the floor heater.

In another aspect, the present invention provides an apparatus for producing a silicon ingot having a directional solidification structure, where the apparatus is equipped with an underfloor heater, a chill plate mounted on the floor heater, a crucible mounted on the chill plate, an overhead heater provided over the crucible and a heat insulator surrounding the circumference of the crucible.

DETAILED DESCRIPTION OF PREFERRED EMBODIMENTS

Figure 1:
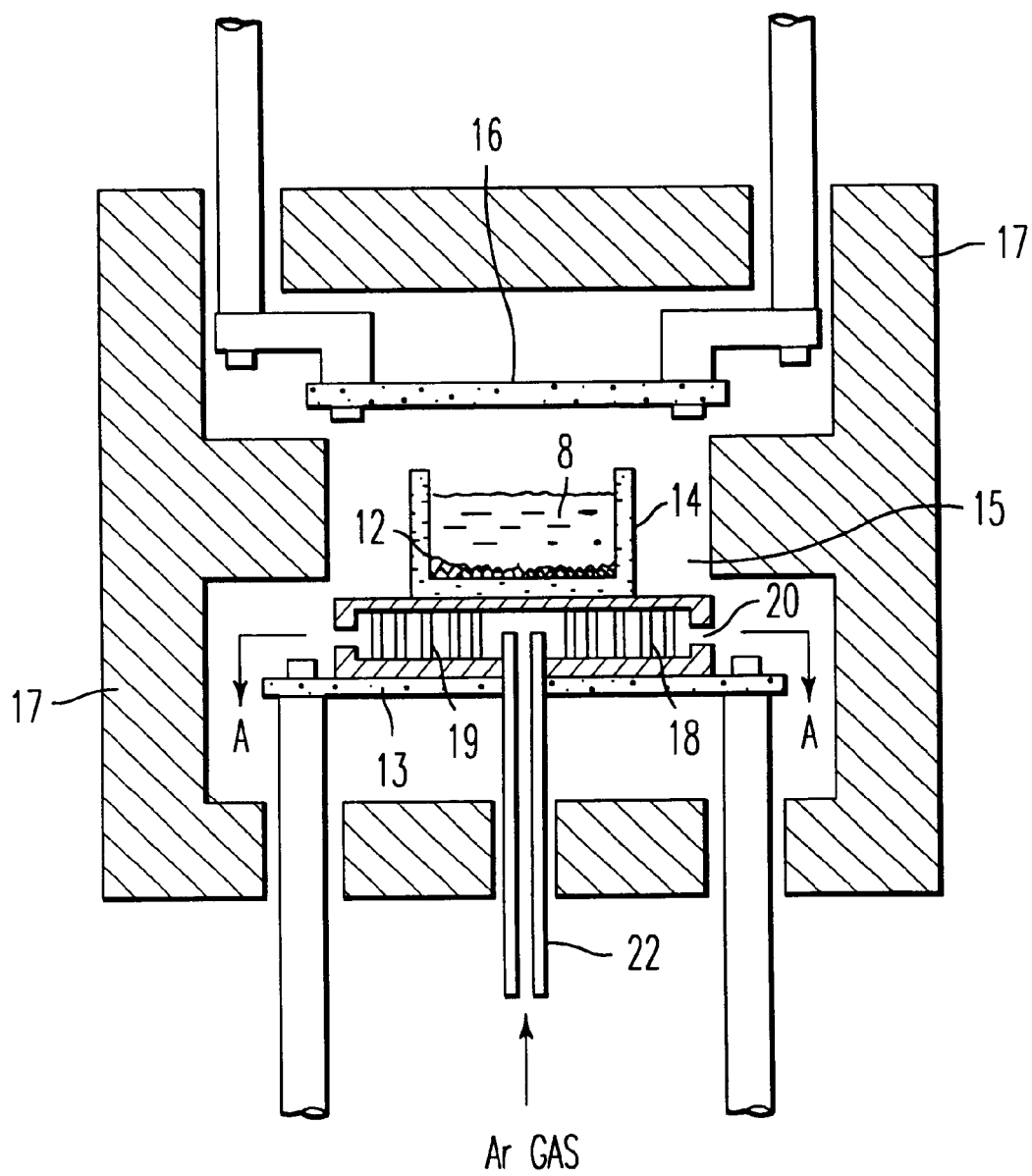
FIG. 1 denotes an illustrative cross section showing an apparatus for producing a silicon ingot having a directional solidification structure according to the present invention.

As shown in FIG. 1, the silicon raw material is placed into a crucible of a melting device constructed by mounting a chill plate 15 on a underfloor heater 13, mounting a crucible 14 having a wide horizontal cross-sectional area on the chill plate 15, providing an overhead heater 16 over the crucible 14, and surrounding the circumference of the crucible 14 with a heat insulator 17. The silicon raw material is heat-melted by flowing an electric current through the underfloor heater 13 and overhead heater 16. A silicon ingot having a directional solidification structure can be produced by halting the electric current or reducing the electric power after completely melting the silicon raw material to form the molten silicon 8, followed by flowing an inert gas through the chill plate 15 to chill the molten silicon from the bottom of the crucible by chilling the bottom of the crucible, along with intermittently or continuously decreasing the temperature of the overhead heater 16 by intermittently or continuously reducing the electric current flow through the overhead heater 16.

An underfloor heater 13, a chilled plate 15 mounted on the underfloor heater 13, a crucible 14 mounted on the chilled plate 15, an overhead heater 16 provided over the crucible and a heat insulator 17 around the circumference of crucible are provided in the apparatus for producing the silicon ingot having a directional solidification structure.

A heat insulator mainly comprising fibrous carbon is used for the heat insulator 17 surrounding the circumference of the crucible 14. When silicon is melted in a crucible containing silica, SiO is formed by the following reaction:

$$SiO_2 + Si \rightarrow 2SiO$$

SiO and fibrous carbon undergo a reaction represented by the following formula:

$$SiO + 2C \rightarrow SiC + CO$$

The CO gas generated reacts with molten Si by the reaction represented by the following formula, leaving SiC in the molten Si to sometimes form a silicon ingot in which SiC is left behind.

$$CO + Si(1) \rightarrow [O]\uparrow + SiC$$

A large quantity of SiC remains especially when a thick silicon ingot is produced because molten state of silicon is required to be kept for a long period of time. It is not preferable to produce a photovoltaic solar cell using a silicon ingot in which SiC is left behind since photovoltaic conversion efficiency is deteriorated. Accordingly, in order to prevent SiC from contaminating the silicon ingot, it is necessary that the CO gas generated by reacting with carbon in the heat insulator is prevented from contacting and reacting with the molten silicon in the crucible by maintaining an inert gas atmosphere in the crucible during melting of silicon. Consequently it is more preferable to maintain the inert gas atmosphere in the crucible during melting of silicon by feeding an inert gas from an inert gas feed device 23 into the crucible as shown in FIG. 3.

Figure 3:
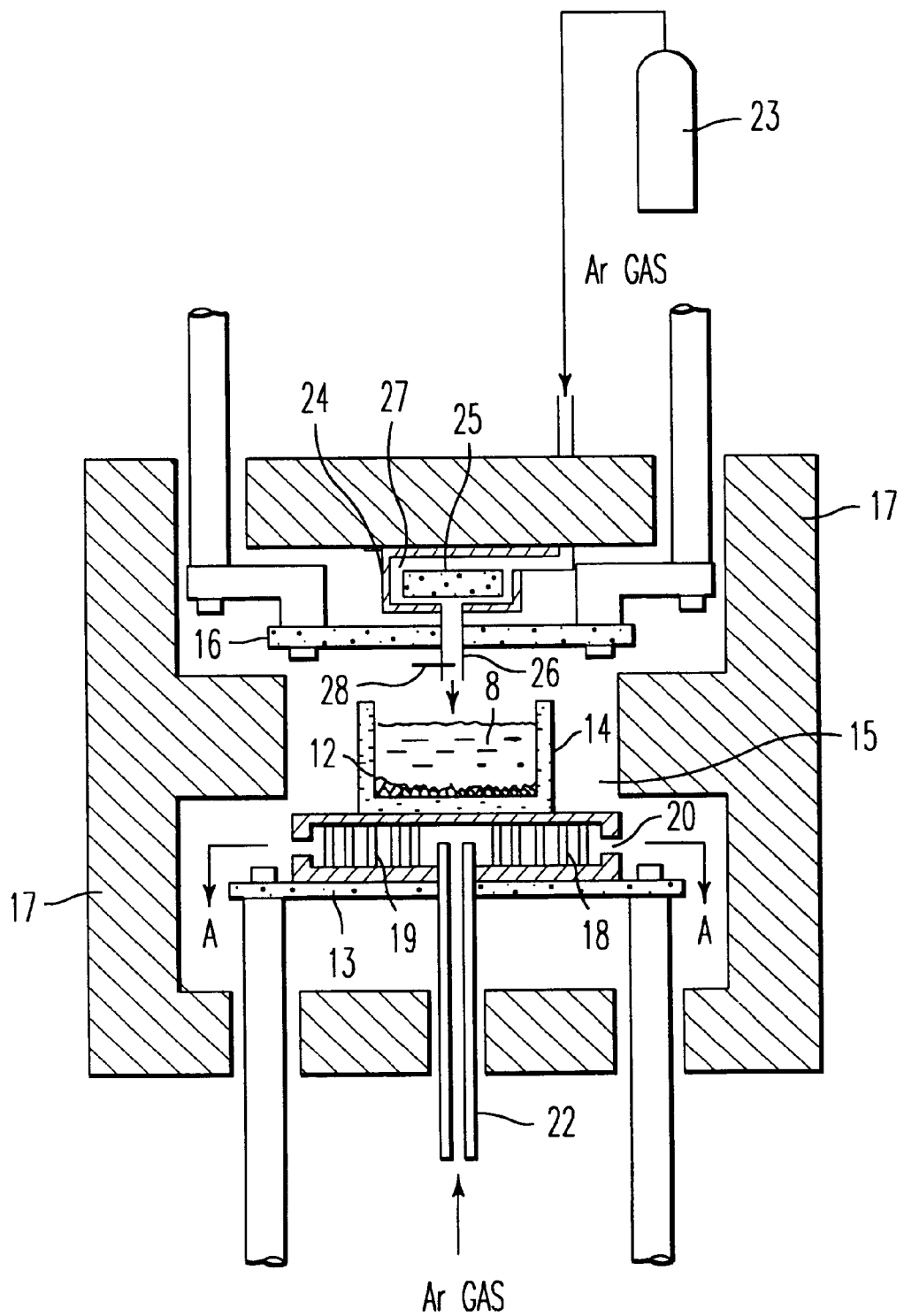
FIG. 3 denotes an illustrative cross section showing an apparatus for producing a silicon ingot having a directional solidification structure according to the present invention.

The method for producing the silicon ingot having a directional solidification structure as shown in FIG. 3 comprises the steps of:

placing a silicon raw material into a crucible 14 of a melting device constructed by mounting a chill plate 15 capable of chilling with a refrigerant on an underfloor heater 13, mounting the crucible 14 on the chill plate 15, providing an overhead heater 16 over the crucible 14, and surrounding the circumference of the crucible 14 with a heat insulator 17;

heat-melting the silicon raw material by flowing an electric current through the underfloor heater 13 and overhead heater 16 while halting refrigerant feed to the chill plate 15, followed by halting the electric current or decreasing the electric power through the underfloor heater 13 after allowing the silicon raw material to completely melt, the molten silicon being chilled from the bottom of the crucible by chilling the chill plate 15 by feeding the refrigerant; and intermittently or continuously lowering the temperature of the overhead heater 16 by intermittently or continuously decreasing the electric current through the overhead heater 16 along with halting the electric current or decreasing the electric power through the floor heater.

The apparatus for producing the silicon ingot having a directional solidification structure is equipped with an underfloor heater 13, a chill plate 15 mounted on the underfloor heater 13, a crucible 14 mounted on the chill plate 15, an overhead heater 16 provided over the crucible, an heat insulator surrounding the circumference of the crucible and a gas feed device 23 for feeding an inert gas into the crucible.

The surface of the molten silicon is preferably maintained in a liquid state in order to sufficiently allowing the molten silicon in the crucible to uniaxially solidify. Therefore, it is preferable to maintain the atmosphere in the crucible under a high temperature inert gas atmosphere heated at a temperature higher than the melting point of silicon. Accordingly, an inert gas heating device 27, having a pre-heating chamber 24 inside of which a pre-heater 25 for heating the inert gas fed from the inert gas feed device 23 is preferably provided as shown in FIG. 3, thereby feeding the inert gas heated with the inert gas heating device 27 into the crucible through a discharge pipe 26. Especially when a temperature sensor 28 is provided at the discharge pipe 26, the temperature of the inert gas flowing out of the discharge pipe 26 can be readily controlled with a program synchronized with the temperature of the overhead heater 16. Since the discharge pipe is always exposed to high temperature, it is preferably made of a heat resistant pipe; pipes made of Mo, C, Al$_2$O$_3$ and SiC being especially preferable as a heat resistant pipe.

As shown in FIG. 3, the silicon ingot having a directional solidification structure is also produced by the steps comprising:

placing a silicon raw material into a crucible 14 of a melting device constructed by mounting a chill plate 15 capable of chilling with a refrigerant on an underfloor heater 13, mounting the crucible 14 on the chill plate 15, providing an overhead heater 16 over the crucible 14, and surrounding the circumference of the crucible 14 with a heat insulator 17;

heat-melting the silicon raw material in the crucible maintained under a high temperature inert gas atmosphere heated at a temperature higher than the melting point of silicon by flowing an electric current through the underfloor heated 13 and overhead heater 16 while halting refrigerant feed to the chill plate 15, followed by halting the electric current or decreasing the electric power through the underfloor heater 13 after completely melting the silicon raw material along with chilling the chill plate 15 by feeding the refrigerant to chill the molten silicon from the bottom of the crucible; and intermittently or continuously decreasing the temperature of the overhead heater 16 by intermittently or continuously reducing the electric current through the overhead heater 16 along with halting the electric current or decreasing the electric power through the underfloor heater.

The apparatus for producing the ingot having a directional solidification structure is provided with an underfloor heater 13, a chill plate 15 mounted on the underfloor heater 13, a crucible 14 mounted on the chill plate 15, a overhead heater 16 provided over the crucible, an inert gas feed device 23 for feeding an inert gas to the crucible and an inert gas pre-heating device 27.

Figure 4:
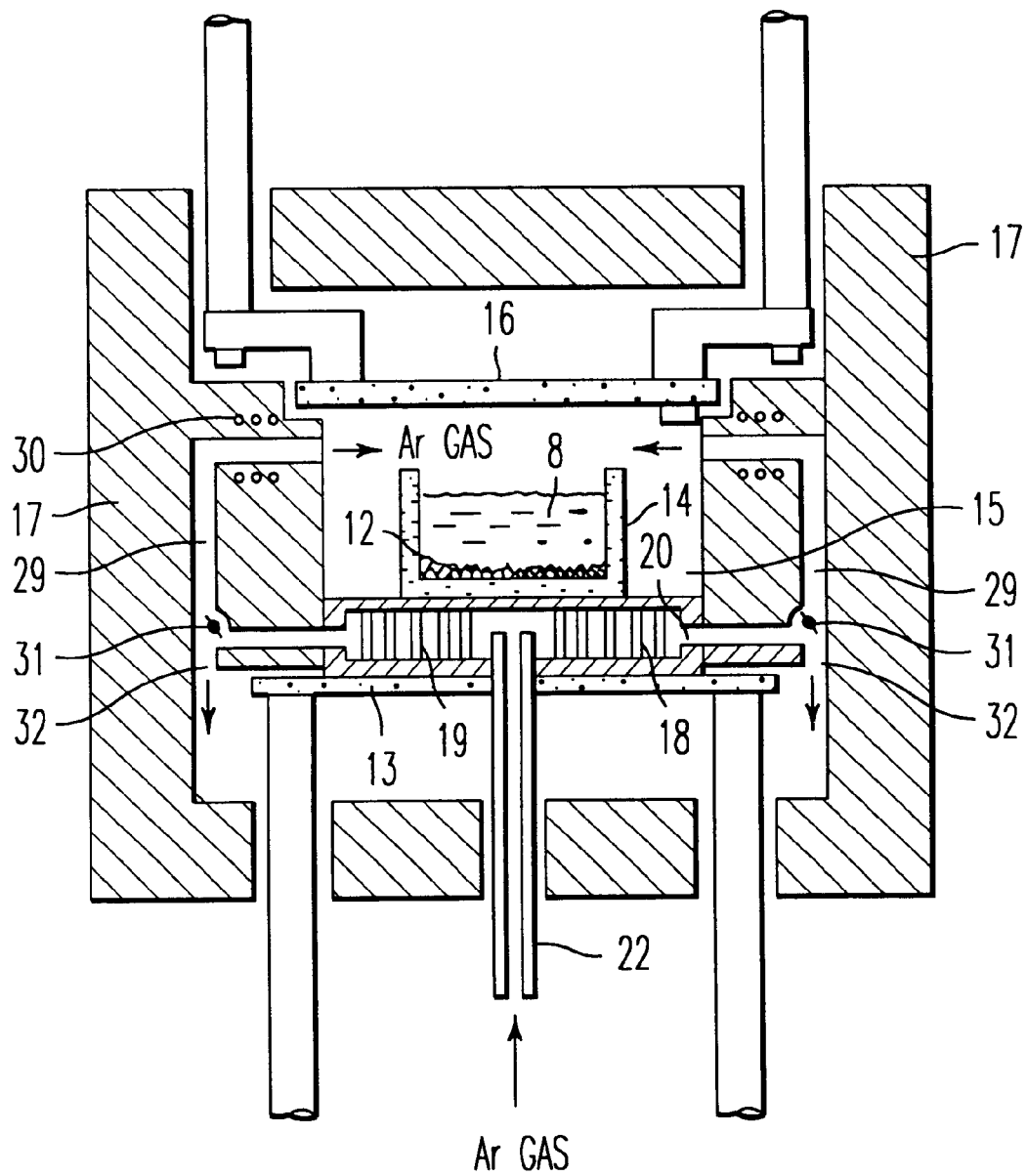
FIG. 4 denotes an illustrative cross section showing an apparatus for producing a silicon ingot having a directional solidification structure according to the present invention.

While water or an inert gas (Ar and He are preferable as an inert gas) are preferably used for the refrigerant to be fed to the chill plate 15 in FIG. 1 and FIG. 3, the inert gas used for chilling the chill plate 15 is allowed to be fed into the crucible through a gas passage 29 as shown in FIG. 4 when the inert gas is used for the refrigerant for chilling the chill plate 15, thereby allowing the inert gas used for chilling the chill plate 15 to recycle for maintaining an inert gas atmosphere in the crucible. The silicon raw material in the crucible is heat-melted by flowing an electric current through the underfloor heater 13 and overhead heater 16 while turning the valve 31 to the position as indicated in FIG. 4. A small quantity of the inert gas is fed into the crucible through the gas passage 29 so that the chill plate is not chilled during heat-melting of the silicon raw material. A high temperature inert gas atmosphere in the crucible can be maintained by feeding the inert gas into the crucible after heating the gas with the pre-heater 30.

When the silicon raw material has been completely melted, the electric current through the underfloor heater is halted or the electric power is decreased along with feeding a large amount of the inert gas to the chill plate to cool the chill plate 15 in order to chill the molten silicon from the bottom of the crucible. Most of the inert gas used for chilling the chill plate 15 is discharged from an outlet 32 by switching the position of the valve 31' but a part of the inert gas used for chilling the chill plate is fed into the crucible through the gas passage 29 while heating the gas with a pre-heater 30 integrated around the gas passage 29, thereby allowing the high temperature inert gas atmosphere to be maintained in the crucible. Only a part of the inert gas used for chilling the chill plate is recycled because, when the feed volume of the inert gas is too large, the gas can not be kept at a high temperature.

Accordingly, the silicon ingot having a directional solidification structure is produced, as shown in FIG. 4, by the steps comprising:

placing the silicon raw material into a crucible of the melting device constructed by mounting a chill plate 15 capable of chilling with the inert gas on the underfloor heater 13, mounting the crucible 14 on the chill plate 15, providing an overhead heater 16 over the crucible 14 and surrounding the circumference of the crucible 14 with a heat insulator 17;

feeding a small amount of the inert gas with heating into the crucible through the gas passage 29 so that the chill plate 15 is not chilled with the gas along with heat-melting the silicon raw material in the crucible by flowing an electric current through the underfloor heater 13 and overhead heater 16, followed by halting the electric current or decreasing the electric power through the underfloor heater 13 after completely melting the silicon raw material along with chilling the chill plate 15 by feeding the inert gas to chill the molten silicon from the bottom of the crucible, a part of the inert gas used for chilling the chill plate 13 being fed into the crucible to maintain an inert gas atmosphere in the crucible; and intermittently or continuously lowering the temperature of the overhead heater by intermittently or continuously reducing the electric current through the overhead heater along with halting the electric current or decreasing the electric power through the underfloor heater.

The apparatus for producing the silicon ingot having a directional solidification structure is provided with an underfloor heater 13, a chill plate 15 mounted on the underfloor heater 13, a crucible 14 mounted on the chill plate 15, an over head heater 16 provided over the crucible 14 and a heat insulator 17 surrounding the circumference of the crucible 14, further provided with a gas passage 29 for flowing the inert gas for recycling the inert gas used for chilling the chill plate and a preheater 30 integrated around the passage 29 for heating the recycling inert gas.

The present invention will be described in more detail referring to FIG. 1 to FIG. 4.

The apparatus for producing the silicon ingot shown in FIG. 1, constructed by mounting a chill plate 15 on an underfloor heater 13, mounting a crucible 14 with large cross-sectional area on the chill plate 15, providing an overhead heater 16 over the crucible 14 and surrounding the circumference of the crucible 14 with a heat insulator 17, is placed in a chamber (not shown in the drawing) capable of controlling the atmosphere so as to prevent the silicon raw material during melting from being oxidized. The silicon raw material is spread on the bottom of the crucible 14 and is heat-melted by flowing an electric current through the underfloor heater 13 and overhead heater 16.

The silicon raw material is allowed to completely melt to form a molten silicon 8, which is then cooled from the bottom of the crucible by halting the electric current or reducing the electric power through the underfloor heater 13 along with chilling the bottom of the crucible by flowing the refrigerant through the chill plate 15 to generate a directional solidification structure 12. Meanwhile, when the temperature of the overhead heater 16 is intermittently or continuously lowered by intermittently or continuously reducing the electric current through the overhead heater 16, the directional solidification structure 12 is further grown upward, enabling to produce a silicon ingot having a directional solidification structure with a wide horizontal cross-sectional area.

Figure 2:
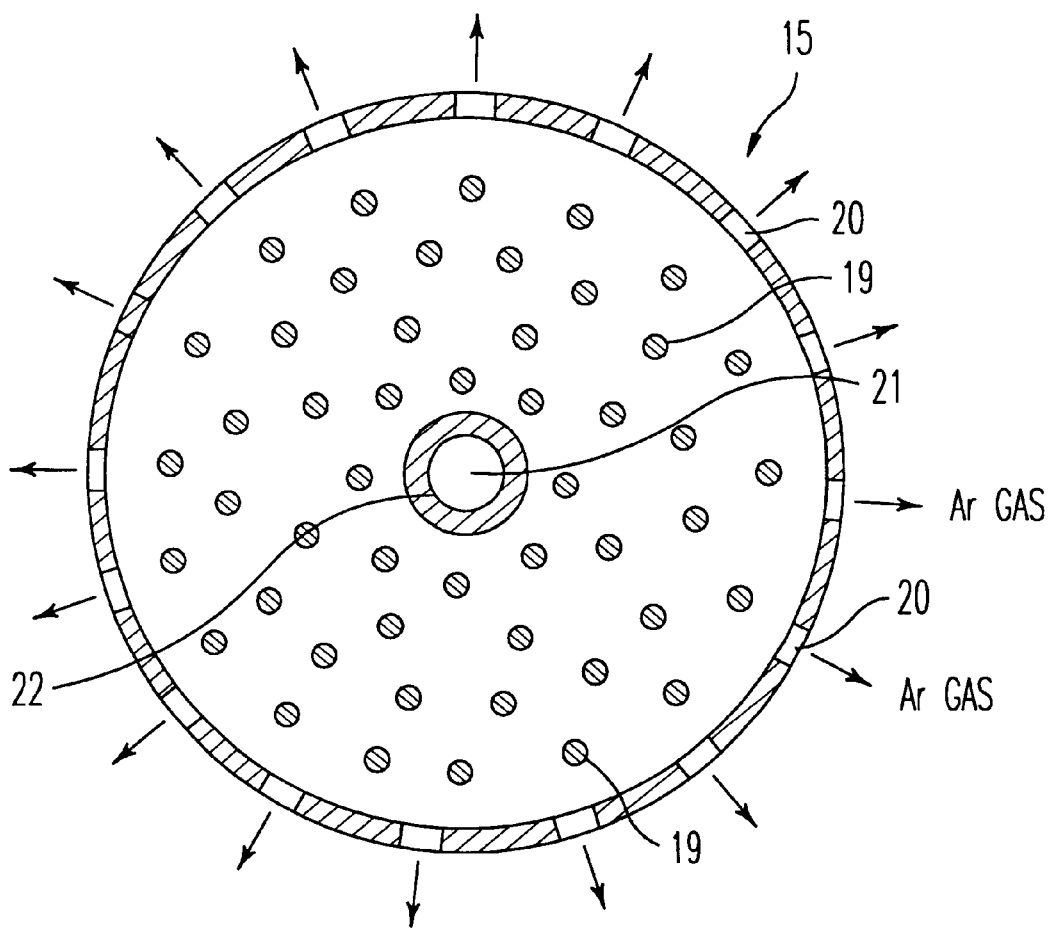
FIG. 2 shows a cross section of the apparatus along the line A—A in FIG. 1.

The chill plate containing a hollow part 18 has a construction in which a plurality of props are attached in the hollow part 18 of the chill plate 15 aligned in parallel relation with each other along the direction perpendicular to the thickness of the chill plate 15. FIG. 2 shows a cross section of the manufacturing apparatus along the line A—A in FIG. 1. As shown in FIG. 1 and FIG. 2, a refrigerant inlet 21 is provided at the center of the chill plate 15 and a feed pipe 22 is connected to the refrigerant inlet 21. A plurality of refrigerant outputs 20 are provided at the side wall of the chill plate 15. The chill plate 15 provided with the refrigerant inlet 21 at its center preferably assumes a disk shape, a plurality of props 19 being disposed in concentric relation so that they are not placed to be adjacent along the radius direction with each other. The larger number of the props 19 allows chilling efficiency with the refrigerant to be improved, along with improving transfer efficiency of the heat from the underfloor heater 13.

While water is usually used for the refrigerant to be fed to the chill plate 15, it is preferable to use an inert gas, most preferably Ar, in the present invention. When the inert gas is fed to the refrigerant inlet 21 provided at the center of the chill plate 15, the gas flows through the spaces among the props 19 and is discharged from a plurality of refrigerant outlets 20. Any heater can be used for the underfloor heater 13 and overhead heater 16, provided that the heaters are able to heat along a plane surface, and the structure and kind of the heater are not especially limited. A carbon heating element processed into a flat shape is preferably used for the underfloor heater 13 and overhead heater 16 in the apparatus for producing the silicon ingot according to the present invention.

Although a heat insulator comprising fibrous carbon is frequently used for the heat insulator 17, SiC is possibly formed when silicon is melted in a silica crucible insulated with the fibrous carbon. Because the silicon substrate produced from an ingot in which SiC remains has poor photovoltaic conversion efficiency, it is preferable that an inert gas feed device for feeding an inert gas in the crucible is provided in order to maintain an inert gas atmosphere in the crucible while silicon is melting, thereby preventing SiC from forming.

FIG. 3 shows an apparatus for producing the silicon ingot having a directional solidification structure according to the present invention, wherein an inert gas feed device for feeding an inert gas into the crucible and an inert gas pre-heating device are further added to the apparatus shown in FIG. 1. Descriptions with respect to the functions of the parts other than the inert gas feed device 23 and inert gas pre-heating device 27 in the apparatus shown in FIG. 3 are omitted herein since the functions of the apparatus are the same as those of the apparatus in FIG. 1 except the inert gas feed device 23 and inert gas pre-heating device 27. The inert gas fed from the inert gas feed device 23 is fed into the crucible after being heated with the inert gas pre-heating device 27 as shown in FIG. 3, maintaining a high temperature (the temperature to allow silicon to melt, preferably about 1450° C. to about 1600° C.) inert gas atmosphere in the crucible. A preheater 25 for heating the inert gas fed from the inert gas feed device 23 and a pre-heating chamber 24 are provided in the inert gas pre-heating device 27, the inert gas pre-heated in the inert gas pre-heating device 27 being fed into the crucible through the discharge pipe 26.

FIG. 4 shows an apparatus for producing the ingot having a directional solidification structure according to the present invention, wherein means for feeding a part of the inert gas used for chilling the chill plate 15 into the crucible after heating as well as for maintaining an inert gas atmosphere in the crucible by recycling the inert gas are added to the apparatus shown in FIG. 1. The functions of the part of the apparatus in FIG. 4 other than the part used for recycling the inert gas are omitted herein since the functions are the same as those of the apparatus in FIG. 1 except the part used for recycling the inert gas.

In the apparatus for producing the silicon ingot having a directional solidification structure shown in FIG. 4, a small amount of the inert gas not allowing the chill plate 15 to be chilled is fed into the crucible from the feed pipe 22 through the gas passage 29 while silicon in the crucible is heat-melting by flowing an electric current through the underfloor heater 13 and overhead heater 16. The inert gas to be fed for the purpose above is fed into the crucible again after heating with a pre-heating coil 30. After allowing the silicon raw material to completely melt, the molten silicon is chilled from the bottom of the crucible by halting the electric current or reducing the electric power through the underfloor heater along with by feeding a large amount of the inert gas to the chill the molten silicon from the bottom of the crucible by chilling the chill plate 15. Most of the inert gas used for chilling the chill plate 15 is discharged from the outlet 32 but a small portion of the inert gas used for chilling the chill plate 15 is fed into the crucible after heating the gas with the preheating coil 30 integrated around the gas passage 29. An appropriate valve operation such as switching the position of the valve 31' allows a small portion of the inert gas used for chilling the chill plate to be fed to the gas passage 29.

Example 1

An apparatus for producing the ingot as shown in FIG. 1 was prepared by mounting a chill plate 15 having a hollow part 18 on an underfloor heater 13, mounting a tray-shaped silica crucible 14 with a depth of 300 mm, an inner diameter of 400 mm and an outer diameter of 450 mm on the hollow chill plate 15, providing an overhead heater 16 over the silica crucible 14 and surrounding the circumference of the crucible 14 with a heat insulator 17.

A large horizontal cross-sectional area silicon ingot having a directional solidification structure with an inner diameter of 200 mm and outer diameter of 400 mm was produced by the steps comprising: placing a silicon raw material in a tray-shaped silica crucible 14 equipped in the apparatus for producing the silicon ingot; heat-melting the silicon raw material by flowing an electric current through an underfloor heater 13 and overhead heater 16 after maintaining an Ar gas atmosphere in the crucible; halting the electric current of the underfloor heater 13 followed by flowing the Ar gas in order to chill the molten silicon from the bottom of the crucible by flowing Ar gas through the chill plate 15 having a hollow part 18; and continuously lowering the temperature of the overhead heater 16 by continuously reducing the electric current through the overhead heater 16.

The degree of orientation of this large horizontal cross-sectional area silicon ingot having a uniaxially oriented polycrystalline solidification texture was evaluated, and a square-shaped polycrystalline silicon substrate with a dimension of 150 mm×150 mm processed from the foregoing ingot was integrated into a solar cell to measure its photovoltaic conversion efficiency. The results of evaluation and measurements are listed in TABLE 1.

Conventional Example 1

Figure 5A:
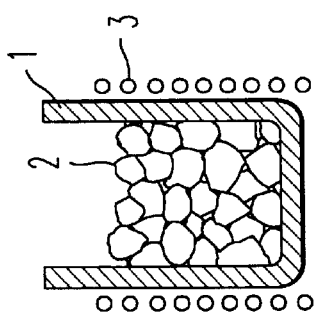
FIG. 5 denotes an illustrative cross section showing an apparatus for producing a silicon ingot having a directional solidification structure and the method for melting the silicon ingot according to the conventional example.
Figure 5B:
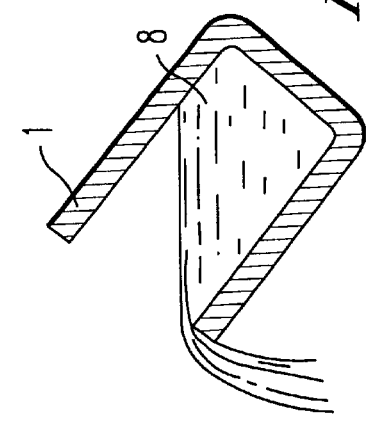
Figure 5C:
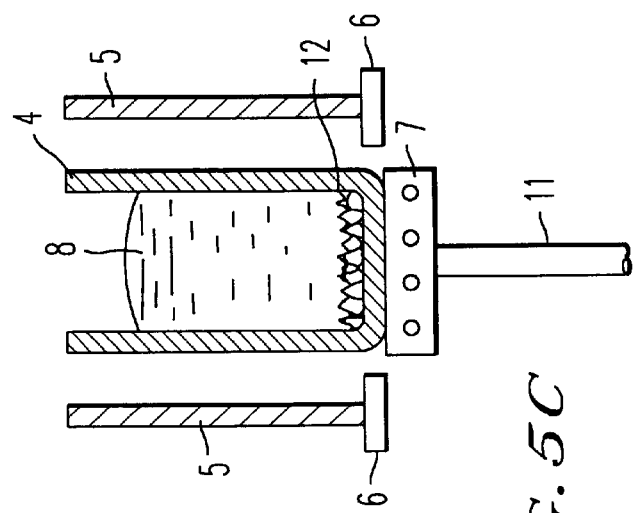

The silica crucible with a depth of 300 mm, an inner diameter of 400 mm and an outer diameter of 450 mm was mounted on a chill plate 7 shown in FIG. 5(b). A large horizontal cross-sectional area silicon ingot having a directional polycrystalline solidification structure with the same thickness of 20 b mm and outer diameter of 400 mm as in Example 1 was produced by the steps comprising: melting the silicon raw material in a conventional silica crucible 1 shown in FIG. 5(a); pouring the molten silicon obtained into the tray-shaped silica crucible as described above; descending the tray-shaped silica crucible filled with the molten silicon at a speed synchronizing with the crystal growth speed of the molten silicon using an elevator shaft 11 together with the chill plate 7; and allowing a directional solidification structure 12 to grow over the entire region of the molten silicon. The degree of orientation of this large horizontal cross-sectional area silicon ingot having a directional polycrystalline solidification structure was evaluated, and a polycrystalline silicon substrate subjected to cutting processing of the foregoing ingot was integrated into a solar cell to measure its photovoltaic conversion efficiency. The results of evaluation and measurements are listed in TABLE 1.

Example 2

As shown in FIG. 3, a wide horizontal cross-sectional area silicon ingot having a directional solidification structure with an inner diameter of 200 mm and outer diameter of 400 mm was produced by the steps comprising: heating the Ar gas fed from an inert gas feed device 23 at a temperature of 1500° C. with an inert gas pre-heating device 23; completely melting the silicon raw material by flowing an electric current through an underfloor heater 13 and overhead heater 16 while continuously feeding the heated Ar gas into the crucible; halting the electric current of the underfloor heater 13 followed by flowing the Ar gas to the chill plate 15 having a hollow part 18 to chill the molten silicon from the bottom of the crucible; and continuously lowering the temperature of the overhead heater 16 by continuously reducing the electric power through the overhead heater 16.

The degree of orientation of this wide horizontal cross-sectional area silicon ingot having a directional polycrystalline solidification structure was evaluated, and a square-shaped polycrystalline silicon substrate with a dimension of 150 mm×150 mm processed from the foregoing ingot was integrated into a solar cell to measure its photovoltaic conversion efficiency. The results of evaluation and measurements are listed in TABLE 1.

Example 3

A molten silicon 8 was produced by completely melting the silicon raw material by flowing an electric current through an underfloor heater 13 and overhead heater 16 as shown in FIG. 4. The electric current through the underfloor heater 13 was halted followed by chilling the bottom of the silica crucible by flowing the Ar gas through a chill plate 15 having a hollow part 18 to chill the molten silicon from the bottom of the crucible. The temperature of an overhead heater 16 was continuously lowered by continuously reducing the electric current through the overhead heater 16. An amount of the Ar gas as small as not to chill the chill plate was fed from a feed pipe 22 and the gas was discharged from a refrigerant exit 20 through the hollow part 18 of the chill plate 15. An Ar gas atmosphere was maintained in the crucible by feeding the Ar gas into the crucible while heating the gas at a temperature of 1500° C. with a pre-heating coil 30 by passing through the gas passage 29. A small portion of the Ar gas used for chilling the chill plate 15 was fed into the crucible through the gas passage 29 while heating the gas at the same temperature as the temperature of the overhead heater with the pre-heater 30 during the period of chilling the bottom of the silica crucible, thereby maintaining an Ar atmosphere in the crucible.

A wide cross-sectional area silicon ingot with a thickness of 200 mm and an outer diameter of 400 mm having a directional polycrystalline solidification structure was produced by the method as described above. The degree of orientation of this silicon ingot was evaluated. A square-shaped polycrystalline silicon substrate with a dimension of 150 mm×150 mm processed from the foregoing ingot was integrated into a solar cell to measure its photovoltaic conversion efficiency. The results of evaluation and measurements are listed in TABLE 1.

| Kind of ingot | Orientation of directional solidified structure | Photovoltaic conversion efficiency (%) |
| --- | --- | --- |
| Silicon ingot obtained in Example 1 | good | 13.2 |
| Silicon ingot obtained in Example 2 | good | 15.2 |
| Silicon ingot obtained in Example 2 | good | 14.1 |
| Silicon ingot obtained in Conventional Example | insufficient | 11.0 |

As evident from the results listed in TABLE 1, the wide cross-sectional area silicon ingot having a directional solidification structure produced according to the present invention has a suitable degree of orientation. In addition, a polycrystalline silicon substrate having an excellent photovoltaic conversion efficiency can be produced from this silicon ingot, whereas a silicon ingot having a polycrystalline solidification structure can not be produced by the conventional method, making it impossible to produce a polycrystalline silicon ingot having an excellent photovoltaic conversion efficiency.

The present invention provides a silicon ingot having a directional solidification structure with a low production cost using a crucible, being especially effective in producing a wide horizontal cross-sectional area silicon ingot having a directional solidification structure with a low production cost using a crucible having a wide cross-sectional area.

Obviously, numerous modifications and variations of the present invention are possible in light of the above teachings. It is therefore to be understood that within the scope of the appended claims, the invention may be practiced otherwise than as specifically described herein.

The disclosures of the priority documents, Patent Application Nos. 10-043526 and 11-029927, which were filed in Japan on Feb. 25, 1998, and Feb. 8, 1999, respectively, are incorporated by reference herein in their entireties.

What is claimed is:

1. A method for producing a silicon ingot having a directional solidification structure, the method comprising:
   placing a silicon raw material into a crucible of a melting device constructed by mounting a chill plate on an underfloor heater, mounting the crucible on the chill plate, providing an overhead heater over the crucible, and surrounding a circumference of the crucible with a heat insulator;
   heat-melting the silicon raw material by flowing electric current through the underfloor heater and the overhead heater without feeding a refrigerant to the chill plate, followed by halting or decreasing the electric current through the underfloor heater after the silicon raw material has been completely melted, the molten silicon being chilled from a bottom of the crucible by chilling the chill plate by feeding the refrigerant; and
   intermittently or continuously lowering a temperature of the overhead heater by intermittently or continuously decreasing the electric current through the overhead heater along with halting the electric current or decreasing the electric power through the underfloor heater.

2. The method according to claim 1, wherein the chill plate has a hollow part and a plurality of props attached to the chill plate in the hollow part with a length of each of the props oriented parallel to a thickness of the chill plate.

3. A method for producing a silicon ingot having a directional solidification structure, the method comprising:
   placing a silicon raw material into a crucible of a melting device constructed by mounting a chill plate on an underfloor heater, mounting the crucible on the chillplate, providing an overhead heater over the crucible, and surrounding a circumference of the crucible with a heat insulator;

heat-melting the silicon raw material in the crucible maintained under an inert gas atmosphere by flowing electric current through the underfloor heater and the overhead heater without feeding a refrigerant to the chill plate, followed by halting or decreasing the electric current through the underfloor heater after the silicon raw material has been completely melted, the molten silicon being chilled from a bottom of the crucible by chilling the chill plate by feeding the refrigerant; and intermittently or continuously lowering a temperature of the overhead heater by intermittently or continuously decreasing the electric current through the overhead heater along with halting the electric current or decreasing the electric power through the underfloor heater.

4. The method according to claim 3, wherein the inert gas atmosphere in the crucible is heated to a temperature range of about 1450° C. to about 1600° C.

5. The method according to claim 4, wherein the chill plate has a hollow part and a plurality of props attached to the chill plate in the hollow part with a length of each of the props oriented parallel to a thickness of the chill plate.

6. The method according to claim 3, wherein the chill plate has a hollow part and a plurality of props attached to the chill plate in the hollow part with a length of each of the props oriented parallel to a thickness of the chill plate.

7. A method for producing a silicon ingot having a directional solidification structure, the method comprising:

placing a silicon raw material into a crucible of a melting device constructed by mounting a chill plate on an underfloor heater, mounting the crucible on the chill plate, providing an overhead heater over the crucible, and surrounding a circumference of the crucible with a heat insulator;

heat-melting the silicon raw material in the crucible by flowing electric current through the underfloor heater and the overhead heater while maintaining an inert gas atmosphere in the crucible by feeding a small amount of the inert gas, insufficient to chill the chill plate, into the crucible through a gas passage, followed by halting or decreasing the electric current through the underfloor heater after the silicon raw material has been completely melted along with chilling the molten silicon from a bottom of the crucible by feeding an amount of the inert gas to the chill plate, maintaining the inert gas atmosphere in the crucible by feeding a part of the inert gas used for chilling the chilling plate into the crucible; and intermittently or continuously lowering a temperature of the overhead heater by intermittently or continuously decreasing the electric current through the overhead heater along with halting the electric current or decreasing the electric power through the underfloor heater.

8. The method according to claim 7, wherein a temperature of the inert gas atmosphere in the crucible is maintained by feeding a part of the inert gas used for chilling the chill plate into the crucible.

9. The method according to claim 8, wherein the chill plate has a hollow part and a plurality of props attached to the chill plate in the hollow part with a length of each of the props oriented parallel to a thickness of the chill plate.

10. The method according to claim 7, wherein the chill plate has a hollow part and a plurality of props attached to the chill plate in the hollow part with a length of each of the props oriented parallel to a thickness of the chill plate.

* * * * *